United States Patent
Oh et al.

(10) Patent No.: US 7,786,752 B2
(45) Date of Patent: Aug. 31, 2010

(54) MEMORY SYSTEMS, ON-DIE TERMINATION (ODT) CIRCUITS, AND METHOD OF ODT CONTROL

(75) Inventors: Reum Oh, Seoul (KR); Dae-Hee Jung, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 357 days.

(21) Appl. No.: 11/873,461

(22) Filed: Oct. 17, 2007

(65) Prior Publication Data

US 2008/0159026 A1    Jul. 3, 2008

(30) Foreign Application Priority Data

Dec. 4, 2006   (KR) .................... 10-2006-0121299

(51) Int. Cl.
  H03K 17/16   (2006.01)
  H03K 19/003  (2006.01)
(52) U.S. Cl. .................................................... 326/30
(58) Field of Classification Search ............... 326/30
  See application file for complete search history.

(56) References Cited

U.S. PATENT DOCUMENTS

| | | | |
|---|---|---|---|
| 4,748,426 A | 5/1988 | Stewart | |
| 5,729,152 A * | 3/1998 | Leung et al. | 326/21 |
| 5,831,467 A * | 11/1998 | Leung et al. | 327/319 |
| 5,953,540 A * | 9/1999 | Raymond | 710/62 |
| 6,087,674 A | 7/2000 | Ovshinsky et al. | |
| 6,531,391 B2 | 3/2003 | Zahorik | |
| 6,566,904 B2 * | 5/2003 | van Bavel et al. | 326/30 |
| 6,573,747 B2 * | 6/2003 | Radhakrishnan | 326/30 |
| 6,754,132 B2 | 6/2004 | Kyung | |
| 7,173,450 B2 * | 2/2007 | Atkinson | 326/30 |
| 7,514,955 B2 * | 4/2009 | Kim | 326/30 |
| 2002/0163355 A1 * | 11/2002 | van Bavel et al. | 326/30 |
| 2003/0062920 A1 * | 4/2003 | Radhakrishnan | 326/30 |
| 2005/0180229 A1 | 8/2005 | Jin | |
| 2005/0264316 A1 * | 12/2005 | Atkinson | 326/30 |

FOREIGN PATENT DOCUMENTS

KR    1020050081315 A    8/2005

* cited by examiner

*Primary Examiner*—James H. Cho
*Assistant Examiner*—Matthew C Tabler
(74) *Attorney, Agent, or Firm*—Volentine & Whitt, PLLC

(57) ABSTRACT

According to one aspect, an on-die termination (ODT) circuit is controlled during transition from a first power mode to a second power mode of a memory device. The transition from an asynchronous ODT circuit path to a synchronous ODT circuit path is delayed to compensate for an operational latency of a delay locked loop (DLL) circuit.

26 Claims, 18 Drawing Sheets

MEMORY SYSTEMS, ON-DIE TERMINATION (ODT) CIRCUITS, AND METHOD OF ODT CONTROL

BACKGROUND OF THE INVENTION

1. Field of the Invention

The present invention generally relates to memory circuits and systems, and more particularly, the present invention relates to memory systems utilizing on-die termination (ODT) schemes, to ODT circuits of memory systems, and to methods of ODT control.

2. Description of the Related Art

Generally, as the bus frequency of a memory system (e.g., a memory system employing DRAM devices) increases, the signal integrity within the memory system degrades. Thus, a variety of bus topologies capable of reducing signal distortion have been developed. For example, it is known that the use of resistive terminations at either the receiver and/or transmitter sides within the memory system is an effective means for absorbing reflections and thereby improving signal performance. Resistive termination configurations of this type generally fall into one of two categories, i.e., passive termination or active termination.

FIG. 1 shows an example of a passive resistive termination in a memory system. In particular, a so-called stub series terminated logic (SSTL) standard is illustrated in which the bus of a memory system 100 is connected to termination voltages Vterm through termination resistors Rterm, and DRAM-mounted memory modules are inserted into slots having predetermined stub resistors Rstub. In this case, the stub resistors Rstub are not mounted on the DRAM chips, and accordingly, the example here is one of an "off-chip" passive resistive termination.

When used in a double data rate (DDR) memory system, the passive resistive termination of the SSTL standard is capable of ensuring a data rate of about 300 Mbps. However, any increase in data rate beyond 300 Mbps tends to degrade signal integrity by increasing the load of the bus having the resistive stubs. In fact, a data rate of 400 Mbps or greater is generally not achievable with the SSTL bus configuration.

FIG. 2 shows an example of a memory system having an active resistive termination, and in particular, an active-termination stub bus configuration. Here, each chipset for controlling the operation of the memory modules, and DRAMs mounted on the respective modules, includes an active termination resistor Rterm. The active termination resistor Rterm is mounted "on-chip" and may be implemented by complementary metal oxide semiconductor (CMOS) devices. In this memory system, active bus termination is achieved through input/output (I/O) ports mounted on the modules.

Each combination of one or more resistive elements Rterm and one or more ON/OFF switching devices in each DRAM is generally referred to herein as an "active terminator". Active terminators can take on any number of different configurations, and FIG. 3 illustrates an example of an active terminator having a center-tapped termination which is described in U.S. Pat. No. 4,748,426. In this example, the effective Rterm of the circuit can be varied between different values (e.g., 150 ohms and 75 ohms) depending on the enable/disable state of signals ON/OFF_1 and ON/OFF_2.

When a DRAM mounted in a memory module is not accessed (e.g., not read or written), the active termination resistor Rterm thereof is enabled by connecting the same to the bus to improve signal integrity. In contrast, when a DRAM is accessed (e.g., read or written), the active termination resistor Rterm thereof is disabled and disconnected from the bus to reduce load.

However, a considerable amount of time is required to enable the active termination resistors installed in the DRAM circuits in response to the active termination control signals, and, for example, when a module-interleaved write/read operation is performed, this time lapse can result in data bobbles, thereby degrading memory system performance. DRAMs which include a delay locked loop (DLL) or phase locked loop (PLL) can overcome this problem by controlling the enabling/disabling of the active termination resistor thereof in synchronization with an external clock. However, in the case where the DLL or PLL is deactivated during a power down or standby mode of a corresponding memory module, enabling/disabling of the active termination resistor cannot be controlled in this manner.

SUMMARY OF THE INVENTION

According to one aspect of the present invention, an on-die termination (ODT) control circuit is provided which includes a mode detection circuit which delays a mode detection signal indicative of an operational mode of the memory device, and which generates a corresponding delayed mode detection signal, a switching circuit which is responsive to the delayed mode detection signal to selectively apply an ODT control signal to an asynchronous circuit path or a synchronous circuit path, and a resistive termination signal generator which generates a resistive termination control signal according to the ODT control signal selectively applied to the asynchronous and synchronous circuit paths.

According to another aspect of the present invention, an on-die termination (ODT) control circuit is provided which generates a resistive termination control signal according to an externally supplied ODT control signal and a delayed lock loop (DLL) signal. The ODT control circuit includes an asynchronous path for transmitting the ODT control signal in an asynchronous mode, a synchronous path for transmitting the ODT control signal in a synchronous mode, and a latch circuit which latches the resistive termination control signal in a transition operation from the asynchronous mode to the synchronous mode.

According to yet another aspect of the present invention, an on-die termination (ODT) control circuit is provided which generates a resistive termination control signal according to an externally supplied ODT control signal. The ODT control circuit includes a mode detection circuit which outputs a mode detection signal, an ODT detection circuit which detects an ODT mode according to the mode detection signal and the ODT control signal, a demultiplexer which selectively applies the ODT control signal to an asynchronous path or an synchronous path, and a control signal generator which generates the resistive termination control signal and which is coupled to outputs of the asynchronous path and synchronous path and to an output of the ODT detection circuit.

According to still another aspect of the present invention, a memory system is provided which includes a data bus, a controller which generates a plurality clock enable signals and an plurality of on-die-termination (ODT) control signals, and a plurality of memory devices coupled to the data bus. Each of the memory devices includes an ODT circuit which is responsive to a respective clock enable signal and a respective ODT control signal to provide a resistive termination for the data bus. Further, the ODT circuit delays the transition from an asynchronous ODT circuit path to a synchronous ODT circuit path to compensate for an operational latency of a delay locked loop (DLL) circuit of the memory device.

According to yet another aspect of the present invention, a method of controlling an on-die termination (ODT) circuit during transition from a first power mode to a second power mode of a memory device is provided. The method includes delaying the transition from an asynchronous ODT circuit path to a synchronous ODT circuit path to compensate for an operational latency of a delay locked loop (DLL) circuit.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF EMBODIMENTS

The present invention will now be described in detail by way of preferred, but non-limiting, embodiments of the invention. The embodiments are presented as examples only, and the invention is not considered to be limited to the specific configurations and/or features of the exemplary embodiments. Like elements are represented by like reference numbers throughout the drawings.

In commonly assigned U.S. Pat. No. 6,754,132, various on-die-termination (ODT) techniques are described.

The '132 patent describes, for example, an ODT control circuit having a synchronous transmission path and an asynchronous transmission path. Briefly, the synchronous path is utilized to process an externally supplied ODT control signal during an active/standby operational mode of the memory device, and the asynchronous path is utilized to process the externally supplied ODT control signal during a pre-charge power down operational mode of the memory device.

Memory devices, such as DDR (double data rate) SDRAM devices, are generally operable in a variety of mode. In particular, during an active/standby mode, a word line of the memory device is either activated or capable of being activated to allow data read/write operations to be executed. In this mode, a delayed lock loop (DLL) circuit which supplies a DLL clock signal to the memory circuits of the memory device is turned ON. In contrast, during a pre-charge power down mode, the DLL circuit is turn OFF while maintaining DLL locking information.

In the '132 patent, in order to maximize signal integrity and optimize current consumption, the DLL clock signal is utilized to enable and disable the ODT control circuit in synchronism with an external clock. This is referred to as a synchronous ODT operation, which requires the DLL to be turned ON. However, since the DLL circuit is turned OFF in the pre-charge power down mode, the ODT control circuit is controlled asynchronously relative to the external clock during this mode. This is referred to an asynchronous ODT operation. The '132 patent describes the use of a synchronous transmission path and an asynchronous transmission path during the synchronous and asynchronous ODT operations, respectively.

Figure 4:
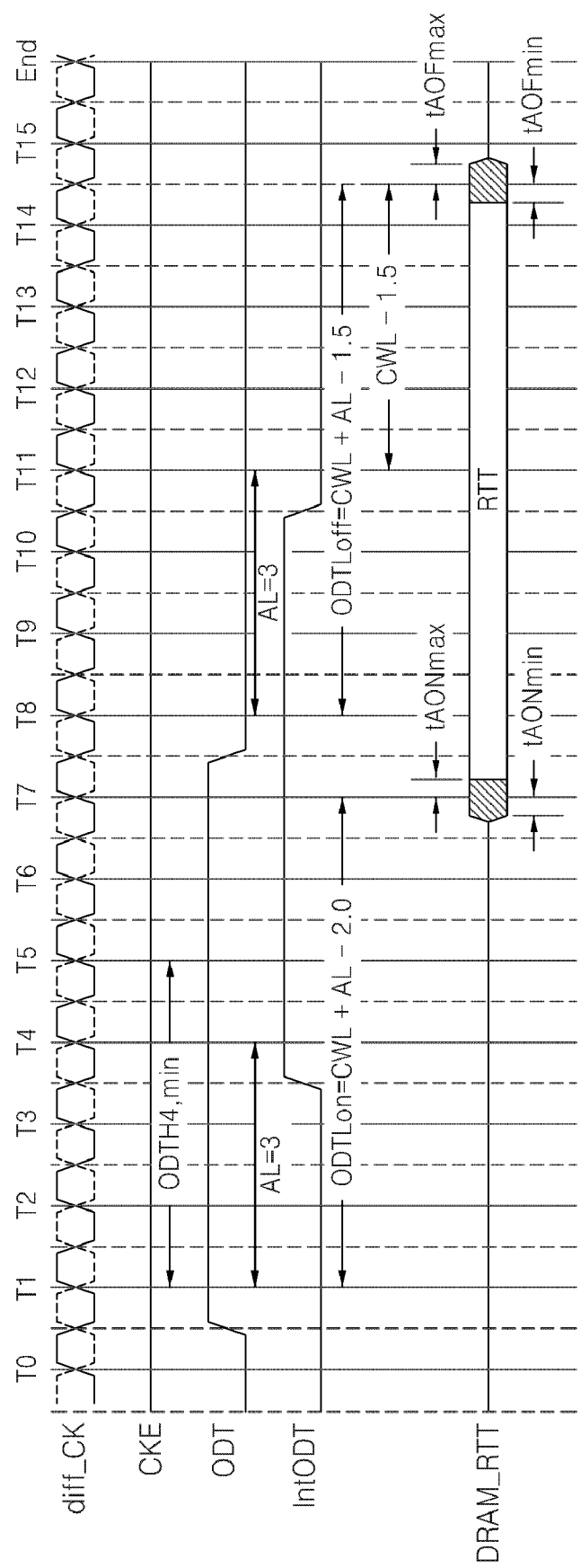
FIG. 4 is a timing diagram for explaining an asynchronous ODT operation.

FIG. 4 is a timing diagram for explaining an example of a synchronous ODT operation of an ODT control circuit that is used to control the connection of a resistive termination circuit (RTT) to an external bus of a memory device.

Referring to FIG. 4, an externally supplied clock enable signal CKE is HIGH. As such, a DLL circuit of the memory device is turned ON.

"ODT" in FIG. 4 denotes an externally supplied ODT control signal which transition to HIGH when the ODT control circuit is to be enabled. In this example, a minimum period (ODTH4, min) of the ODT signal is four (4) clock signals.

"IntODT" denotes the time period in which the ODT control circuit is enabled in response to the externally supplied ODT control signal. As illustrated, a latency (AL=3) of three (3) clock cycles exists between HIGH-transition of the ODT signal and enablement of the ODT control circuit. Likewise, the same latency (AL=3) exists between the LOW-transition of the ODT signal and disablement of the ODT control circuit. The latency AL is a program additive latency.

"DRAM_RTT" denotes the time period in which an external data bus is terminated by the resistive termination circuit (RTT) in response to enablement of the ODT control circuit.

Still referring to FIG. 4, an "ODT on-latency" (ODTLon) between activation of the ODT control signal to actual termination of the external bus by the RTT is (CWL+AL−2.0) clock cycles. Here, CWL denotes a CAS write latency, which varies according to the type of memory device. For example, in the case of DDR3 SDRAM memories, CWL may have a value of between 5 and 8 clock cycles, inclusive. As mentioned above, AL denotes a program additive latency which is programmed into a mode register (MR) and can also vary from device to device. The sum of CWL and AL corresponds to a write latency WL of the memory device (i.e., WL=CWL+AL). In the example of FIG. 4, CWL is 5 clock cycles, and AL is 3 clock cycles. Thus, the ODT on-latency ODTLon is 6 clock cycles (5+3−2).

An "ODT off-latency" (ODTLoff) between deactivation of the ODT control signal (to LOW) to deactivating the resistive termination of the external bus by the RTT is (CWL+AL−1.5) clock cycles. Again, in the example of FIG. 4, CWL is 5 clock cycles, and AL is 3 clock cycles. Thus, the ODT off-latency ODTLoff is 6.5 clock cycles (5+3−1.5).

In the synchronous operation of the ODT control circuit, activation and deactivation of the RTT is precisely controlled. This is represented in FIG. 4 by a minimum RTT turn-on time "tAONmin" and a maximum RTT turn-on time "tAONmax" which occur within a single clock cycle. In particular, tAONmin is a point in time in which a high impedance state is exited and the ODT resistance begins to turn ON. tAONmax denotes a point in time in which the ODT resistance is fully ON. Likewise, a minimum turn-off time tAOFmin and a maximum turn-off time tAOFmax occur within a single clock cycle.

Figure 5:
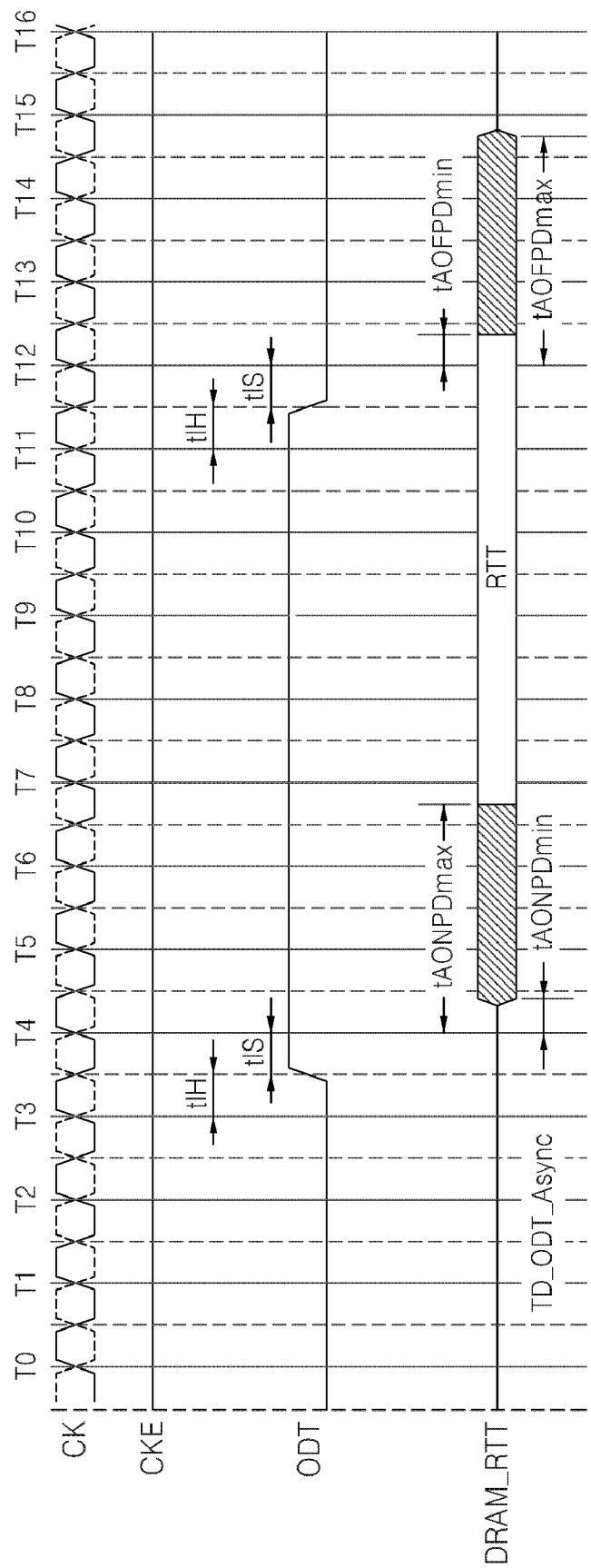
FIG. 5 is a timing diagram for explaining a synchronous ODT operation.

Reference is now made to FIG. 5, which is a timing diagram showing an example of an asynchronous operation.

In this case, the DLL circuit is turn OFF, and the clock enable signal CKE is LOW. The externally supplied ODT control signal is transferred asynchronously to control the RTT after a delay time. In particular, for example, an asynchronous RTT turn-on delay "tAONPD" may vary between a minimum (min) of 1 nanosecond, and a maximum (max) of 9 nanoseconds. Similarly, an asynchronous RTT turn-off delay "tAOFFPD" may vary between a minimum (min) of 1 nanosecond, and a maximum (max) of 9 nanoseconds.

Figure 6:
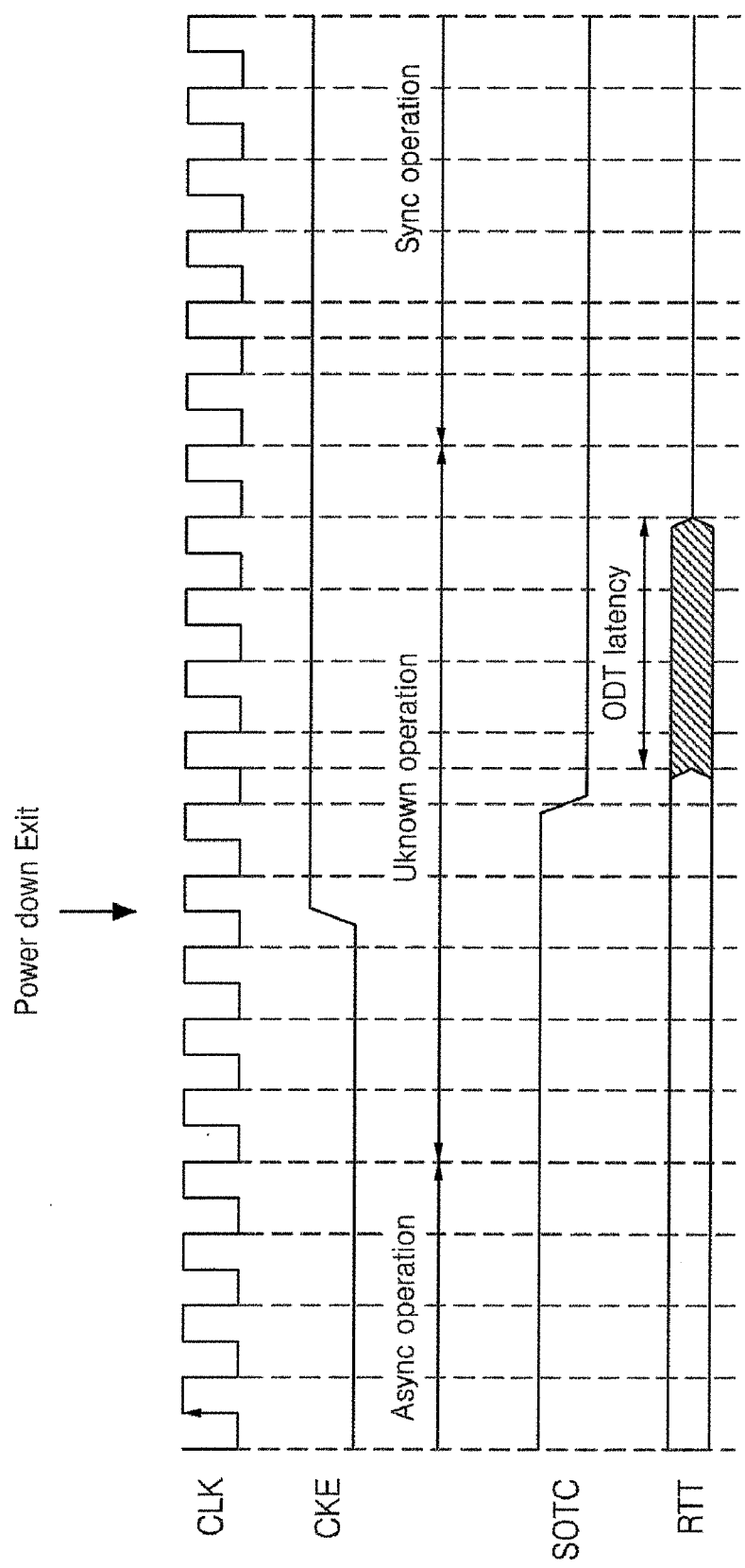
FIG. 6 is a timing diagram for explaining an ODT operation during an unstable period of a delayed lock loop (DLL) circuit.

Reference is now made to FIG. 6, which is a timing diagram for describing a problem that can arise in the synchronous/asynchronous ODT control described above in connection with FIGS. 4 and 5.

In particular, FIG. 6 illustrates the case where the clock enable signal CKE transitions form LOW to HIGH while the ODT control signal is HIGH. This can occur at the exit of the pre-charge power down mode to the active/standby mode. At this time, the DLL circuit is turned ON. However, the DLL circuit is operationally unstable for a period of time. This unstable period is identified as "tXPDLL" in FIG. 6, and may be on the order of ten (10) to twenty (20) clock cycles.

In FIG. 6, the ODT control signal is active (HIGH) for a period of time during the unstable period tXPDLL of the DLL circuit.

As explained previously, during the period in which the clock enable signal CKE is LOW, the asynchronous operation can be executed (see FIG. 5 above). During the period in which the DLL circuit is stable, the synchronous operation can be executed (see FIG. 4 above). However, when the ODT control signal is HIGH during the unstable period of the DLL circuit, the ODT circuit cannot be reliably controlled, and signal integrity can be negatively impacted. The embodiments that follow are at least partially directed to overcoming this problem.

Figure 7:
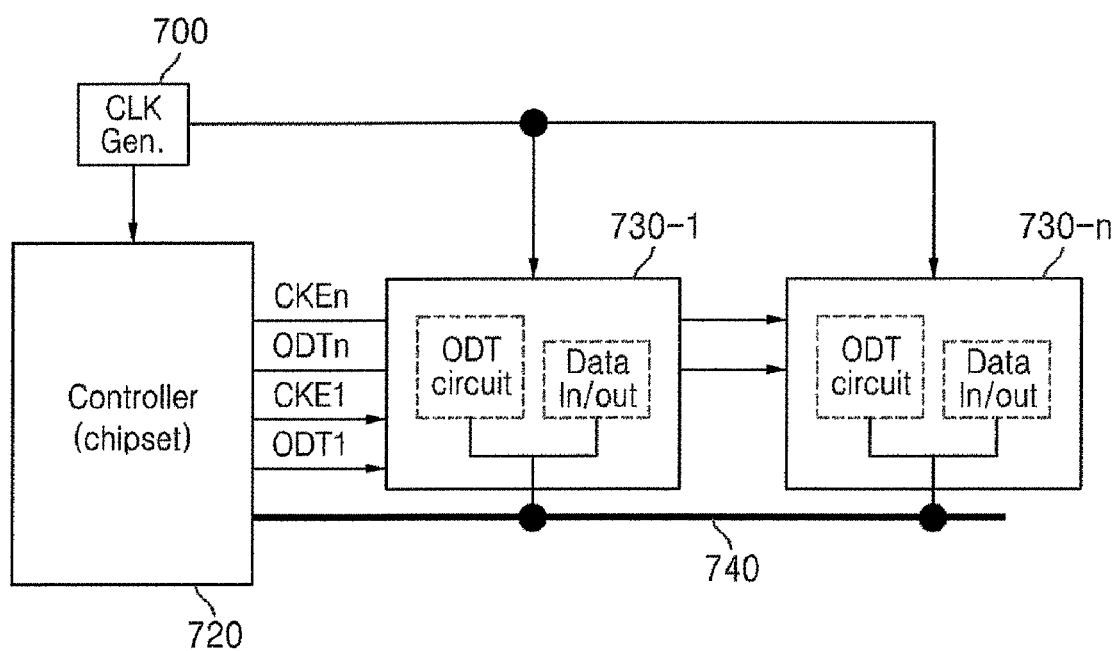
FIG. 7 illustrates a memory system according to an embodiment of the present invention.

FIG. 7 illustrates a memory system according to exemplary embodiment of the present invention. As shown, the memory system includes a clock generator 710, a memory controller (chipset) 720, a plurality of memory devices 730-1 through 730-n, and a data bus system 740. Here, "n" is an integer of two or more.

The memory devices 730 may, for example, be DRAM circuits such as DDR SDRAM circuits. Further, the memory devices 730 may, for example, be mounted on separate memory modules. Alternately, two or more of the memory devices 730 can be mounted in the same memory module. The memory modules may, for example, be single inline memory modules (MIMM's) or dual inline memory modules (DIMM's).

Each of the memory devices 730 includes an ODT circuit and data in/out (I/O) circuitry connected to the data bus system 740. As is explained in more detail later, the ODT circuits are responsive to respective clock enable signals CKE1 through CKEn and ODT control signals ODT1 through ODTn generated by the controller 720. Further, the controller 720 and the memory devices 730-1 through 730-n receive a clock signal CLK generated by the clock generator 710.

Figure 8:
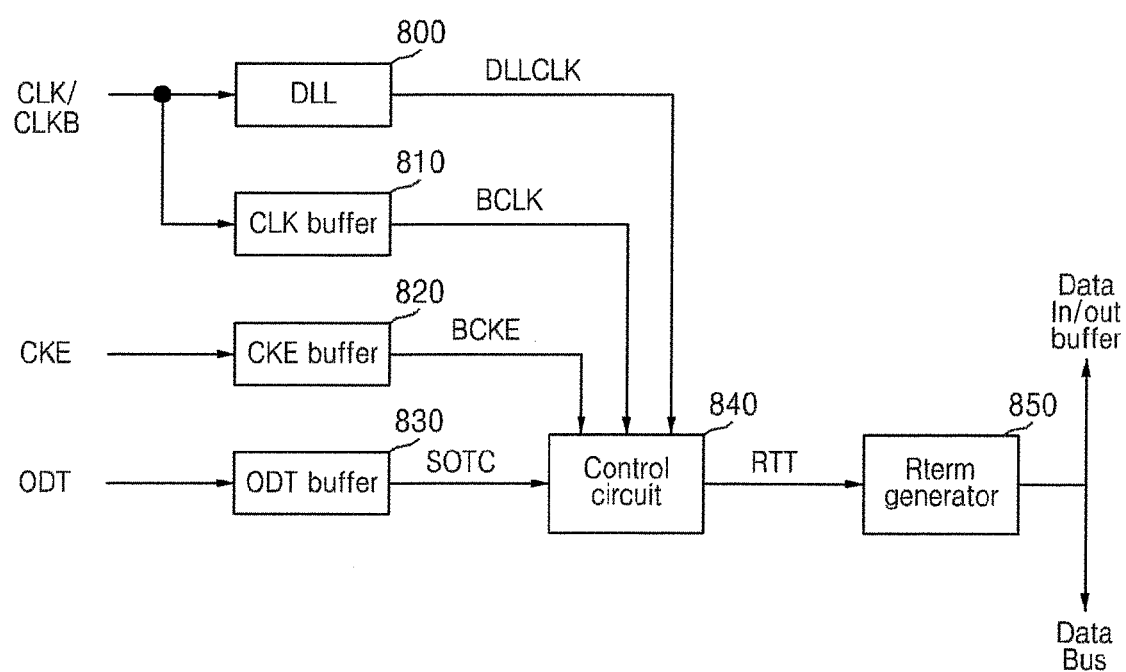
FIG. 8 illustrates an ODT circuit according to an embodiment of the present invention.

FIG. 8 is a block diagram illustrating an ODT control circuit of FIG. 4 according to an exemplary embodiment of the present invention. As shown, the ODT circuit of this example includes a delay locked loop (DLL) 800, a clock signal (CLK) buffer 810, a clock enable signal (CKE) buffer 820, an on-die termination (ODT) signal buffer 830, a control circuit 840, and a resistive termination (Rterm) generator 850.

As will be appreciated by those skilled in the art, the components illustrated in FIG. 8 need not function exclusively on behalf of the ODT control circuit. For example, the DLL 800, CLK buffer 810 and CKE buffer 820 may provide generally functionality for other components of the corresponding memory device 730.

In operation, the DLL 800 receives the externally supplied clock signal CLK/CLKB, and generates a DLL clock signal DLLCLK that is synchronized with the clock signal CLK/CLKB. In the memory system example of this embodiment, the clock signal CLK/CLKB is supplied from the clock signal generator 700 illustrated in FIG. 4.

The CLK buffer 810 also receives the clock signal CKL/CLKB, and outputs a corresponding buffered clock signal BCLK.

The CKE buffer 820 receives an externally supplied clock enable signal CKE, and outputs a corresponding buffered clock enable signal BCKE. In the memory system example of this embodiment, the clock enable signal CKE is supplied from the controller 720 illustrated in FIG. 4. In the non-limiting examples presented herein, the clock enable signal CKE is logic LOW when the memory device is in a power down mode, and the clock enable signal CKE transitions to logic HIGH when memory device exits the power down mode.

The ODT signal buffer 830 receives an externally supplied ODT signal, and outputs a corresponding buffered ODT signal SOCT. In the memory system example of this embodiment, the ODT signal is supplied from the controller 720 illustrated in FIG. 4. In the non-limiting examples presented herein, the ODT signal is logic HIGH when the Rterm generator 850 (described below) is activated, and logic LOW when the Rterm generator 850 is deactivated (or not activated).

Those skilled in the art will be well acquainted with various internal circuit configurations of the DLL 800, the CLK buffer 810, the CKE buffer 820 and the ODT signal buffer 830 that may be utilized to realize embodiments of the present invention. Thus, a detailed structural description of these components is omitted here for simplicity.

The ODT control circuit 840 generates a resistive termination control signal RTT according to the DLL clock signal DLLCLK, the buffer clock signal BCLK, the buffered clock enable signal BCKE, and the buffered ODT signal SOCT. The control circuit 840 will be described in greater detail later herein in the form of exemplary, but non-limiting, embodiments.

Figure 1:
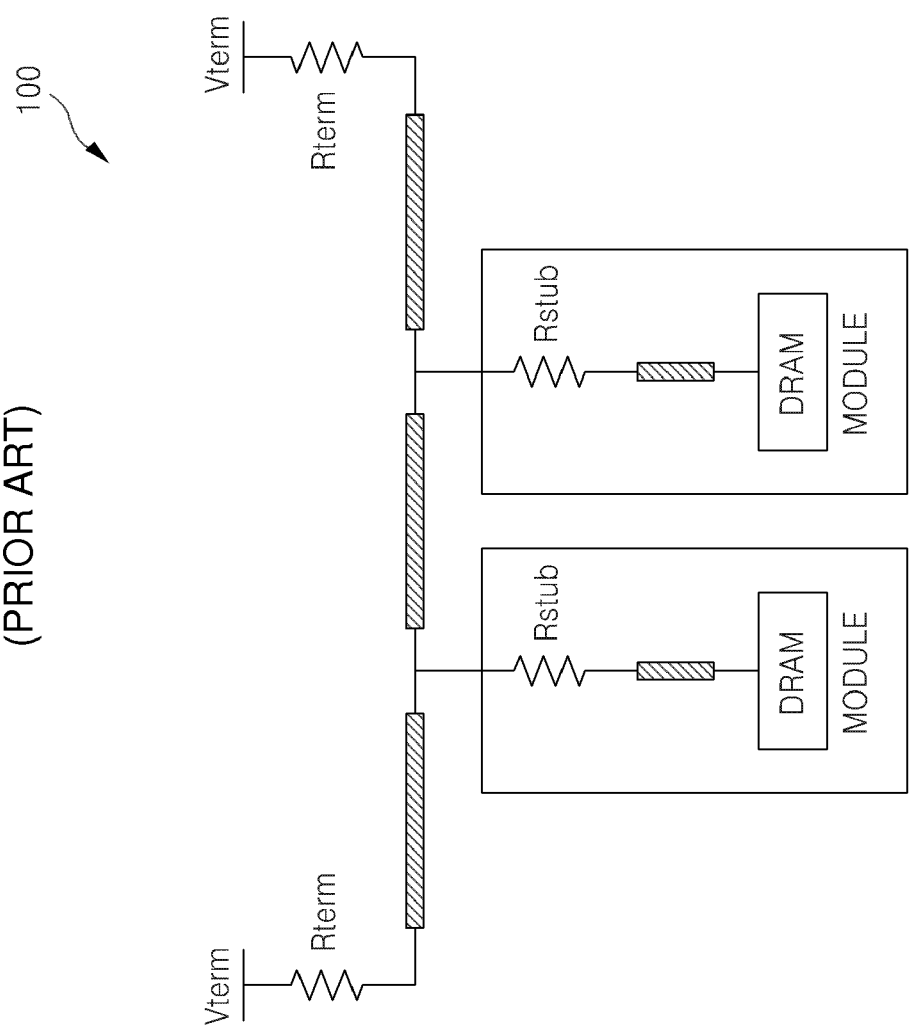
FIG. 1 illustrates a memory system having a conventional stub series terminated logic (SSTL) configuration.
Figure 2:
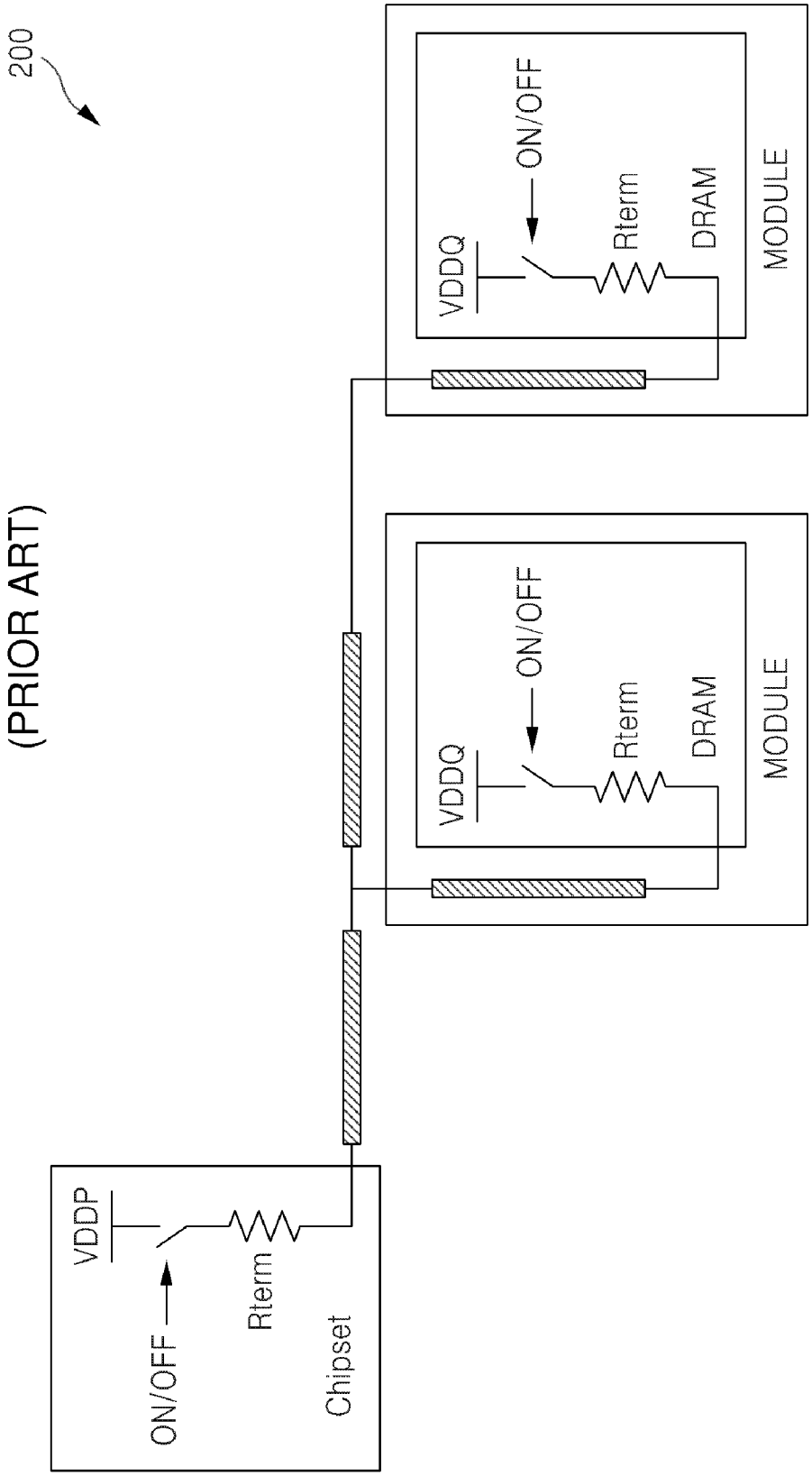
FIG. 2 illustrates a memory system having a conventional active-termination stub bus configuration.
Figure 3:
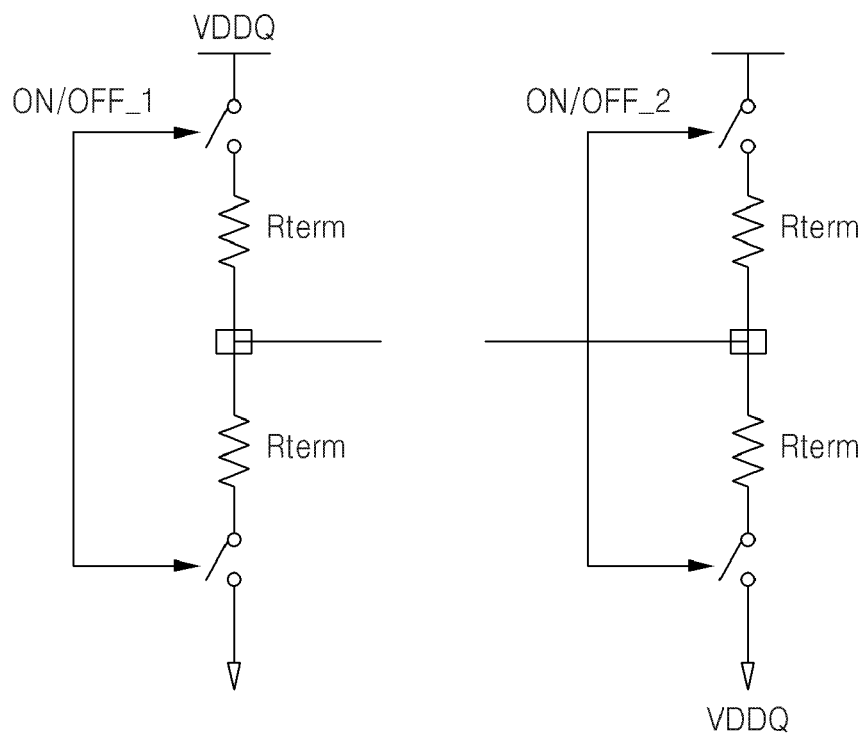
FIG. 3 illustrates an example of a conventional active terminator having a center-tapped termination.

The Rterm generator 850 is activated and deactivated in response to the resistive termination control signal RTT generated by the control circuit 840. When activated, the Rterm generator 850 provides a termination resistance for the corresponding memory device of the ODT circuit. When deactivated, no termination resistance for the corresponding memory device is provided. The Rterm generator 850 may be structurally implemented as desired. For example, Rterm generator 850 may be configured as shown in previously described FIG. 3.

An example of the ODT control circuit 840 of FIG. 8 will now be described with reference to FIG. 9.

Figure 9:
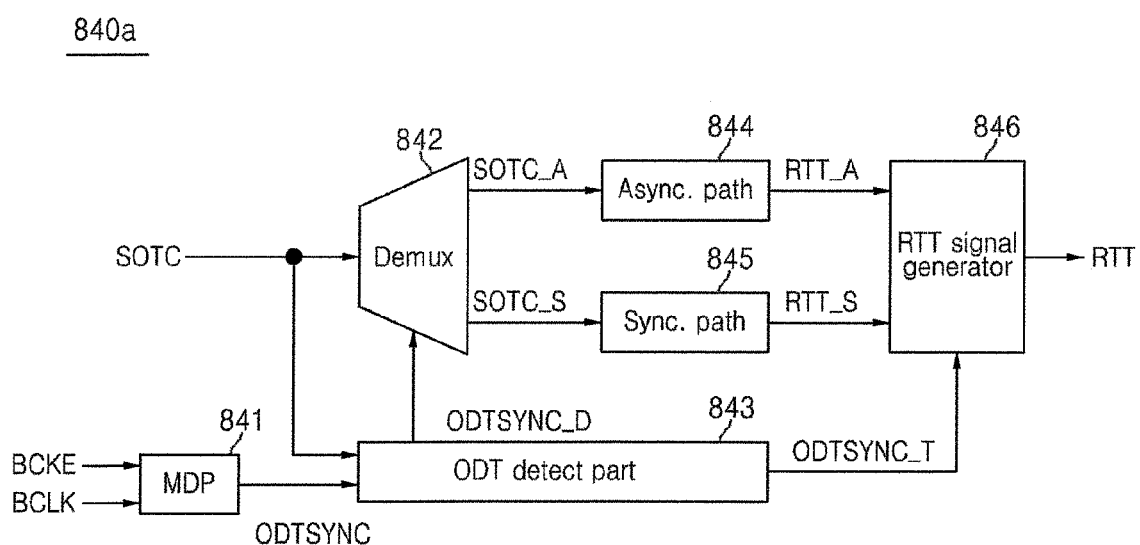
FIG. 9 illustrates an ODT control circuit according to an embodiment of the present invention.

Referring to FIG. 9, the ODT control circuit 840a of this example includes a mode detecting circuit (MDP) 841, a de-multiplexer 842, an ODT detecting circuit 843, an asynchronous circuit path 844, a synchronous circuit path 845, and an RTT signal generator 846.

The mode detecting circuit (MDP) 841 generates a mode detection signal ODTSYNC based on a logic level of the buffered clock enable signal BCKE. In particular, for example, when the buffered clock enable signal BCKE is logic LOW, the memory device is in a pre-charge power down mode, and the mode detection signal ODTSYNC is logic LOW. When the memory device is to the exit the power down mode, the buffered clock enable signal BCKE transitions to logic HIGH, and the mode detection signal ODTSYNC is transitioned to logic HIGH in synchronism with the buffered clock signal BCKL. Although not shown in the drawings, the mode detecting circuit MDP 841 may be implemented, for example, by a flop-flop circuit. In this case, the buffered clock signal BCKL may be applied to the clock terminal of the flip-flop circuit, and the buffered clock enable signal BCKE may be applied to an input terminal of the flip-flop circuit.

The ODT detecting circuit 843 delays the mode detection signal ODTSYNC signal by a specified time period to thereby generate a delayed mode detection signal ODTSYNC_D. This aspect of the embodiment will be described in greater detail later herein. In addition, the ODT detecting circuit 843 is responsive to the delayed mode detection signal ODTSYNC_D to detect the logic state of the buffered ODT signal SOTC, and to output a corresponding detection signal ODTSYNC_T. This aspect of the embodiment will also be described in greater detail later herein.

The de-multiplexer 842 is responsive to the delayed mode detection signal ODTSYNC_D to apply the buffered ODT signal SOTC to either one of the asynchronous circuit path 844 or the synchronous circuit path 845. As an example, if the delayed mode detection signal ODTSYNC_D is LOW, the buffered ODT signal SOTC may be applied to the asynchronous circuit path. If the delayed mode detection signal ODTSYNC_D is HIGH, the buffered ODT signal SOTC may be applied to the synchronous circuit path 845. Examples of the asynchronous circuit path 844 and the synchronous circuit path 845 will be described later herein.

The RTT signal generator 846 outputs an RTT signal (to the Rterm generator 850 of FIG. 8) in response to the RTT control signals RTT_A and RTT_S respectively output from the asynchronous circuit path 844 and the synchronous circuit path 845.

The operation of the ODT control circuit 840a will be described in more detail with respect to the exemplary circuit implementation of FIG. 10.

Figure 10:
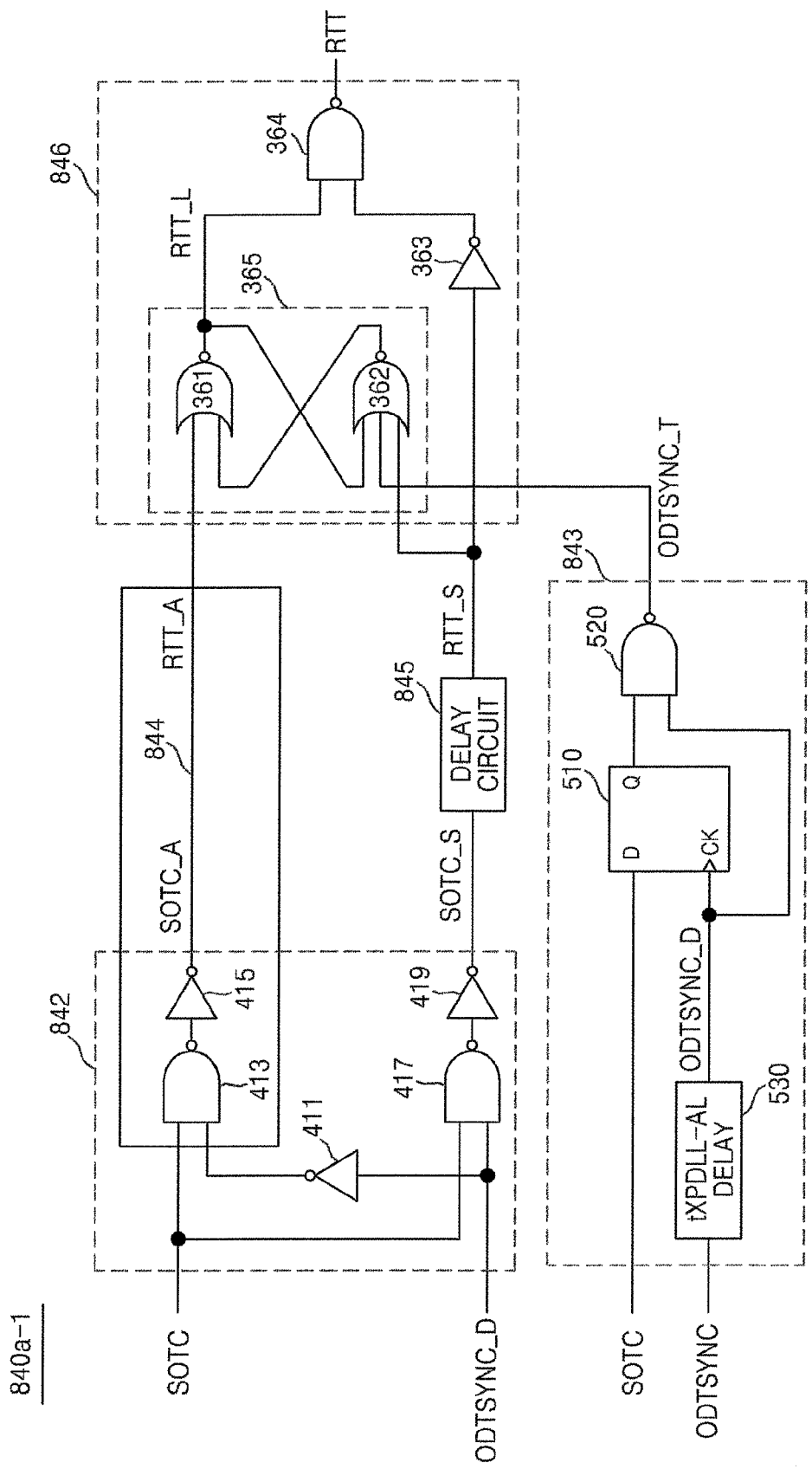
FIG. 10 illustrates an example circuit configuration of an ODT control circuit according to an embodiment of the present invention.

Referring to the control circuit 840a-1 of FIG. 10, the ODT detection part 843 includes a delay circuit 530 which delays the mode detection signal ODTSYNC signal by tXPDLL-AL. As discussed previously herein, tXPDLL is a number of clock cycles corresponding to an unstable period of the DLL circuit after being turned ON, and AL is the program additive latency. The resultant delayed mode detection signal ODTSYNC_D is applied to the clock CK terminal of a D-flip flop 510 and an input terminal of a logic gate (NAND) 520 of the ODT detection part 843. The D terminal of the D-flip flop 510 receives the buffered ODT signal SOTC, and the Q terminal of the D-flip flop 520 is applied to the other input terminal of the logic gate 520.

The output of the logic gate 520 is shown in FIG. 10 as an ODTSYNC_T output signal. It is noted that the when the ODTSYNC_D (or ODTSYNC) signal is LOW, the ODTSYNC_T output signal is HIGH regardless of the state of the buffered ODT signal SOTC. On the other hand, when ODTSYNC_D is HIGH and the buffered ODT signal SOTC is LOW, the ODTSYNC_T is HIGH. When ODTSYNC_D is HIGH and the buffered ODT signal SOTC is HIGH, the ODTSYNC_T becomes LOW.

The demultiplexer 842 of this example includes inverters 411, 415 and 419, and NAND gates 413 and 417, connected as shown in FIG. 10 to receive the delayed mode detection signal ODTSYNC_D and the buffered ODT signal SOTC. The inverter 411 inverts the delayed mode detection signal ODTSYNC_D, and the NAND gate 413 performs a logical NAND operation of the buffered ODT signal SOTC and the inverted delayed mode detection signal ODTSYNC_D. The inverter 415 inverts the output of the NAND gate 413, and applies the inverted output to the asynchronous path 844. The NAND gate 417 performs a logical NAND operation of the buffered ODT signal SOTC and the delayed mode detection signal ODTSYNC_D. The inverter 419 inverts the output of the NAND gate 417, and applies the inverted output to the synchronous path 845.

The asynchronous path 844 of this example is formed simply of a delay line. On the other hand, the synchronous path 845 is formed of a delay circuit, an example of which is illustrated in FIGS. 11 and 12.

Figure 11:
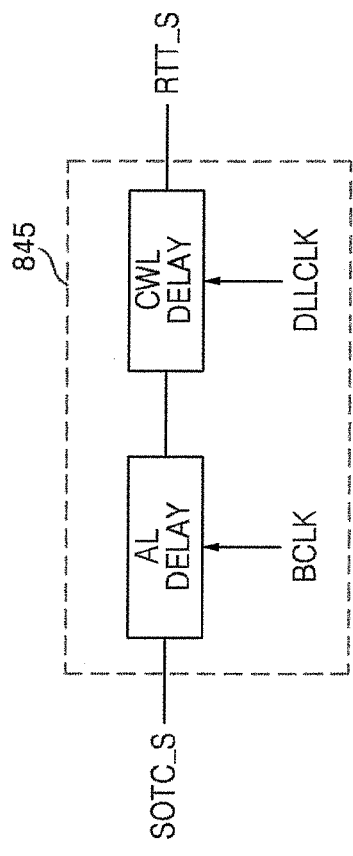
FIGS. 11 and 12 illustrate examples of delay circuit contained in a synchronous path of an ODT control circuit according to an embodiment of the present invention.
Figure 12:
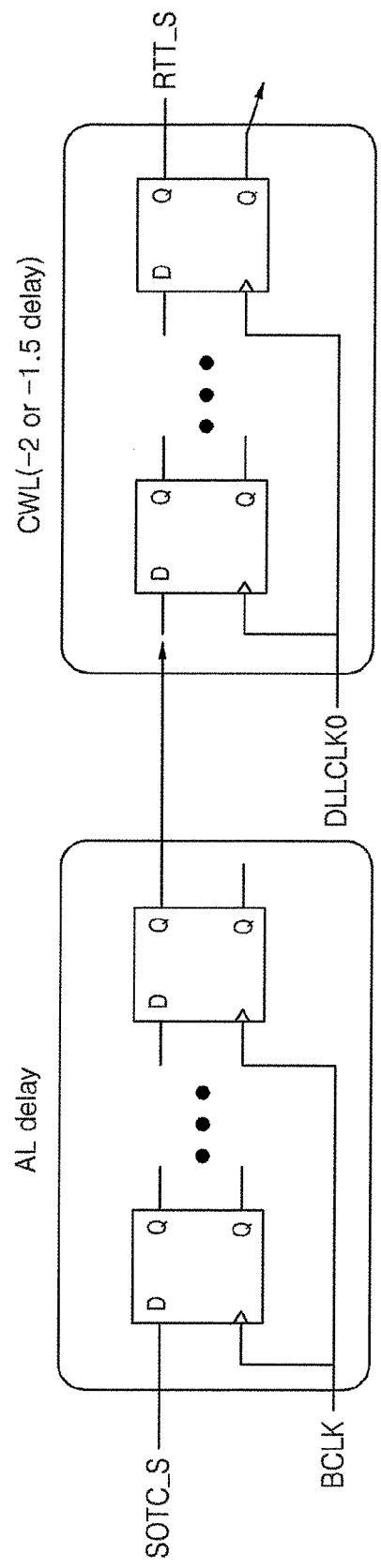

That is, referring to FIG. 11, the synchronous path 845 includes an additive latency (AL) delay controlled by an internal clock signal PCLK, and a CAS write latency (CWL) delay controlled by the DLL clock signal DLLCLK. The internal clock signal PCLK may be the same as the buffered clock signal BCLK (see FIG. 8). The internal clock signal PCLK is enabled soon after the clock enable signal goes HIGH, whereas the DLL clock signal DLLCLK is enabled after the time period tXPDLL has elapsed after the clock enable signal CKE goes HIGH. FIG. 12 illustrates a circuit example of the synchronous path 845 of FIG. 11, where the AL delay includes a number of flip-flop circuits having clock terminals connected to the internal clock signal PCLK, and where the CWL delay circuit includes a number of flip-flop circuits having clock terminals connected to the DLL clock signal DLLCLK.

Returning to FIG. 10, the RTT signal generator 846 of this example includes a latch 365 (NOR gates 361 and 362), an inverter 363 and a NAND gate 354. The ODTSYNC_T output signal and the RTT control signals RTT_A and RTT_S are applied to the NOR gates 361 and 362 as shown, and the latch output RTT_L thereof is applied to one input of the NAND gate 364. The other input of the NAND gate 364 receives an inverted RTT_S signal from the inverter 363. The output of the NAND gate 364 is the RTT signal applied to the Rterm generator 850 (FIG. 8).

Figure 13:
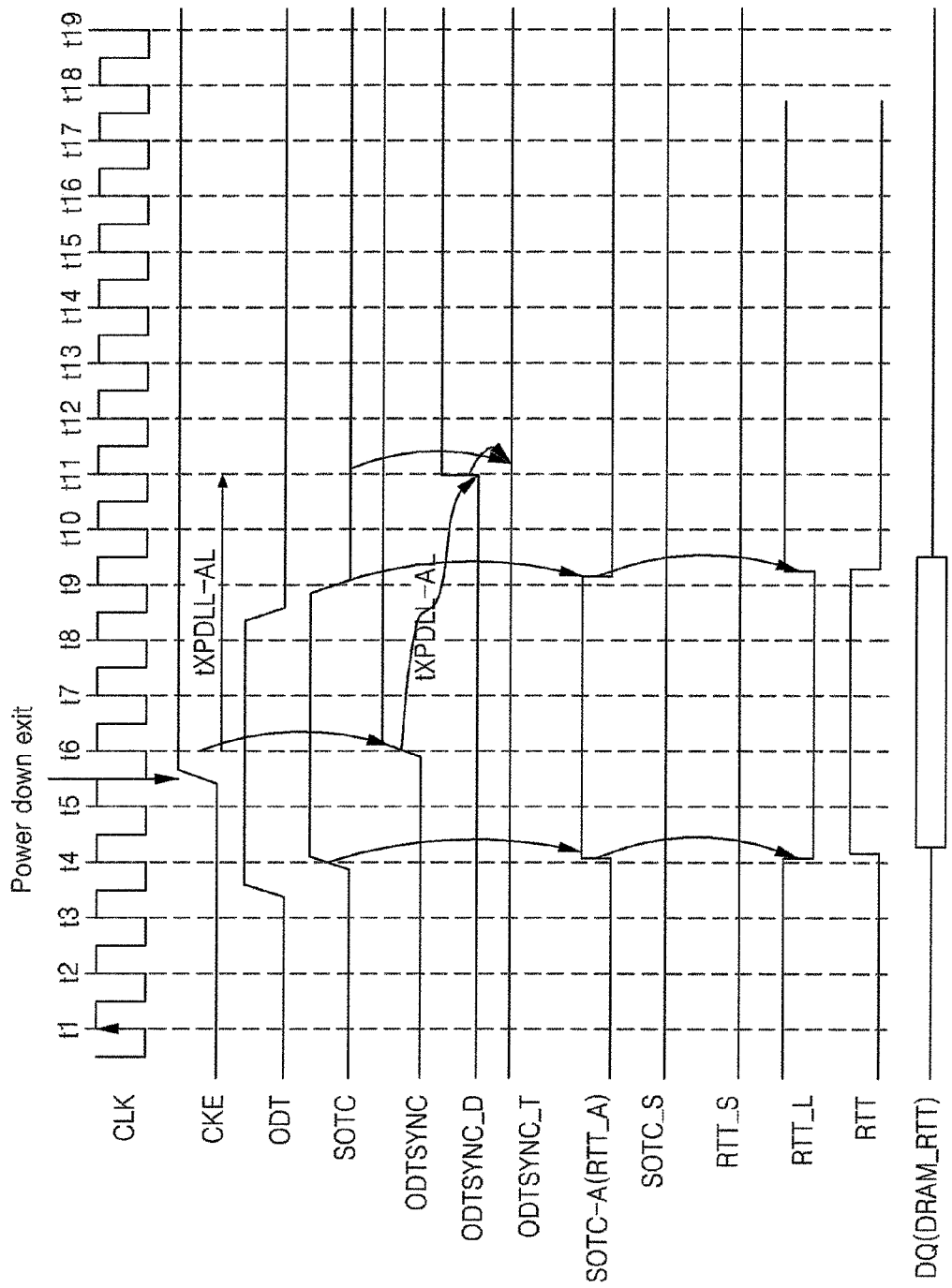
FIGS. 13 and 14 are timing diagrams for explaining an operation of the ODT control circuit illustrated in FIG. 9.
Figure 14:
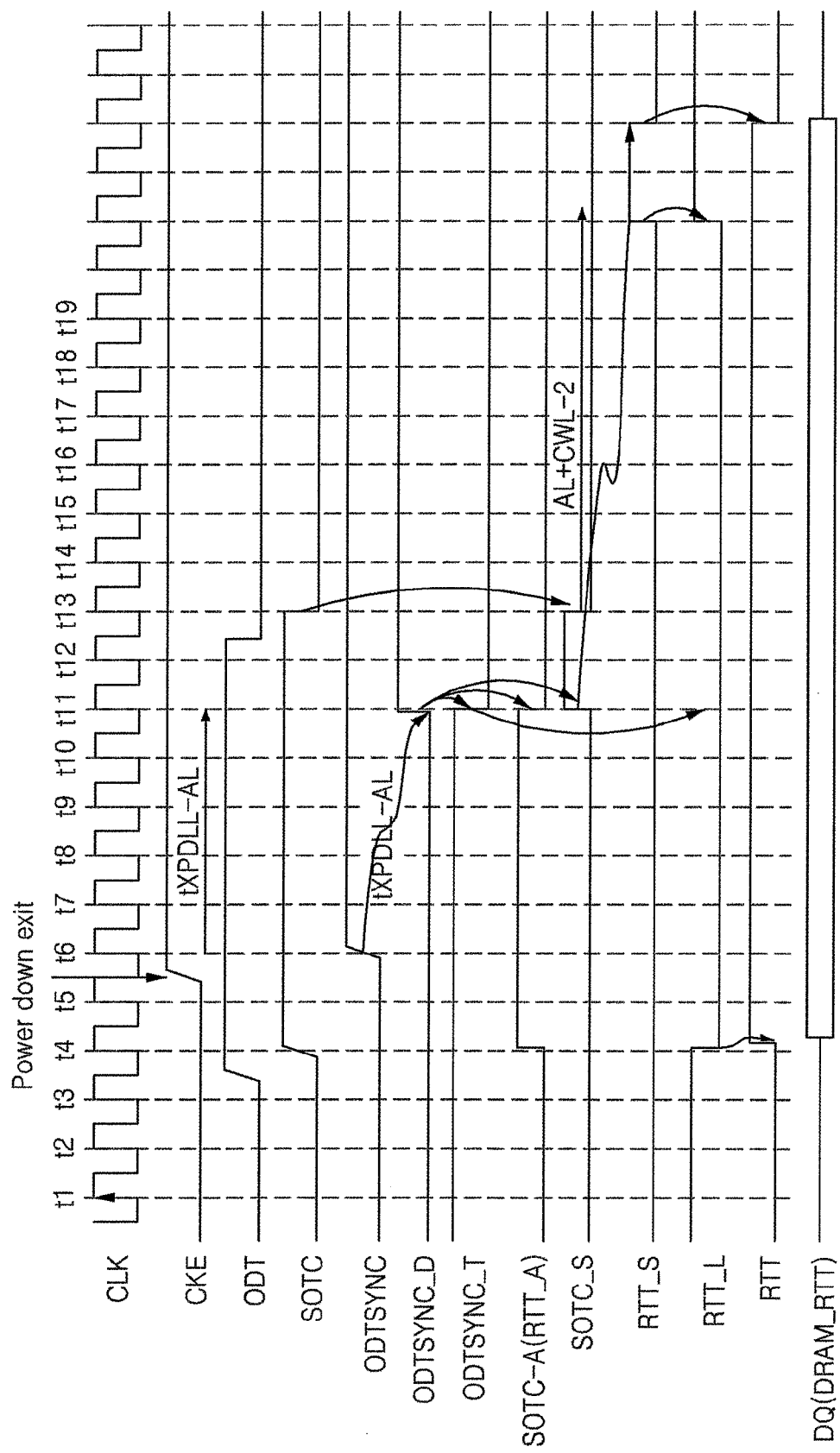

Operational examples of the control circuit 840a-1 of FIG. 10 will now be described with reference to the timing diagrams of FIGS. 13 and 14. In each of FIGS. 13 and 14, a power down exit occurs (i.e., the clock enable signal CKE goes HIGH) while the ODT control signal ODT is active (HIGH). FIG. 13 depicts the case where the ODT control signal ODT returns to LOW before the time period tXPDLL-AL has elapsed after the clock enable signal CKE goes HIGH. FIG. 14 depicts the case where the ODT control signal ODT remains HIGH after the time period tXPDLL-AL has elapsed after the clock enable signal CKE goes HIGH.

Referring collectively to FIGS. 10 and 13, the ODT control signal goes HIGH, and shortly thereafter the buffered ODT control signal SOTC goes HIGH. At this time, the clock enable signal CKE is LOW (i.e., the DLL circuit is OFF), and the delayed ODTSYNC_D signal is LOW. Thus, the signal SOTC_A (RTT_A) on the asynchronous path 844 goes HIGH, the signal RTT_L goes LOW, and the output signal RTT goes HIGH. As such, the resistive termination circuit DRAM_RTT is activated in an asynchronous operation.

Next, while the ODT control signal remains HIGH, the power down exit occurs in which the clock enable signal CKE is activated. The DLL circuit is thereby activated, which causes the ODTSYNC signal to go HIGH. However, since the ODTSYNC signal is delayed by tXPDLL-AL, the asynchronous operation is maintained at this time.

In FIG. 13, the ODT control signal goes LOW prior to the lapse of the time period tXPDLL after the clock enable signal CKE goes HIGH. The buffered ODT signal SOTC then goes LOW, which causes the RTT output signal to go LOW, thus terminating the asynchronous operation.

After the time period tXPDLL, the ODTSYNC_D signal goes HIGH. However, since the buffer ODT signal SOTC is LOW at this time, the RTT output signal remains LOW.

As stated above, FIG. 14 depicts the case where the ODT control signal ODT remains HIGH after the time period tXPDLL-AL has elapsed after the clock enable signal CKE goes HIGH.

In particular, referring collectively to FIGS. 10 and 14, the ODT control signal goes HIGH, and shortly thereafter the buffered ODT control signal SOTC goes HIGH. At this time, the clock enable signal CKE is LOW (i.e., the DLL circuit is OFF), and the delayed ODTSYNC_D signal is LOW. Thus, the signal SOTC_A (RTT_A) on the asynchronous path 844 goes HIGH, the signal RTT_L goes LOW, and the output signal RTT goes HIGH. As such, the resistive termination circuit DRAM_RTT is activated in an asynchronous operation.

Next, while the ODT control signal remains HIGH, the power down exit occurs in which the clock enable signal CKE is activated. The DLL circuit is thereby activated, which causes the ODTSYNC signal to go HIGH. However, since the ODTSYNC signal is delayed by tXPDLL-AL, the asynchronous operation is maintained at this time.

Then, after the time period tXPDLL-AL has elapsed after the ODTSYNC signal goes HIGH (in response to the HIGH state of the clock enable signal CKE), the delayed ODTSYNC_D signal goes HIGH. Since the buffered ODT signal SOTC remains HIGH (i.e., the ODT signal remains HIGH) at this time, the asynchronous buffered ODT signal SOTC_A (RTT_A) goes LOW and the ODTSYNC_T signal goes HIGH. As such, even though the asynchronous signal RTT_A is LOW, the latch output RTT_L remains LOW as a result of the HIGH state of the ODTSYNC_T signal. Thus, the HIGH state of the RTT output signal is maintained. Further, the synchronous buffered ODT signal SOTC_S goes HIGH as a result of the HIGH state of the delayed ODTSYNC_D signal.

Thereafter, in FIG. 14, the ODT control signal goes LOW, and shortly thereafter, the buffered ODT control signal SOTC goes LOW. This causes the synchronous buffered ODT signal SOTC_S to go LOW, but does not alter the ODTSYNC_T signal since the delayed ODTSYNC_D signal remains HIGH.

The synchronous buffered ODT signal SOTC_S is delayed by the delay circuit 845 for a time period of AL+CWL−2 to obtain the synchronous RTT signal RTT_S. When the synchronous RTT signal RTT_S goes HIGH, the latch output RTT_L goes LOW. However, the RTT output signal remains HIGH as a result of the inverted RTT signal RTT_S from the inverter 363.

When the synchronous RTT signal RTT_S goes LOW, the RTT output signal goes LOW, and the resistive termination DRAM_RTT is terminated.

As described above, the transition from an asynchronous ODT circuit path to a synchronous ODT circuit path is delayed to compensate for an operational latency of a delay locked loop (DLL) circuit. In this manner, ODT execution is not adversely impacted by the unstable DLL operation that occurs for a time period after the DLL is turned on.

The invention is not limited to the specific embodiment described above, and many variations will be readily apparent to those skilled in the art. As one example only, FIG. 15 illustrates a modification in which the delay time of the ODTSYNC delay is tXPDLL-(AL+α), and the SOTC_S delay time is AL+α.

Figure 15:
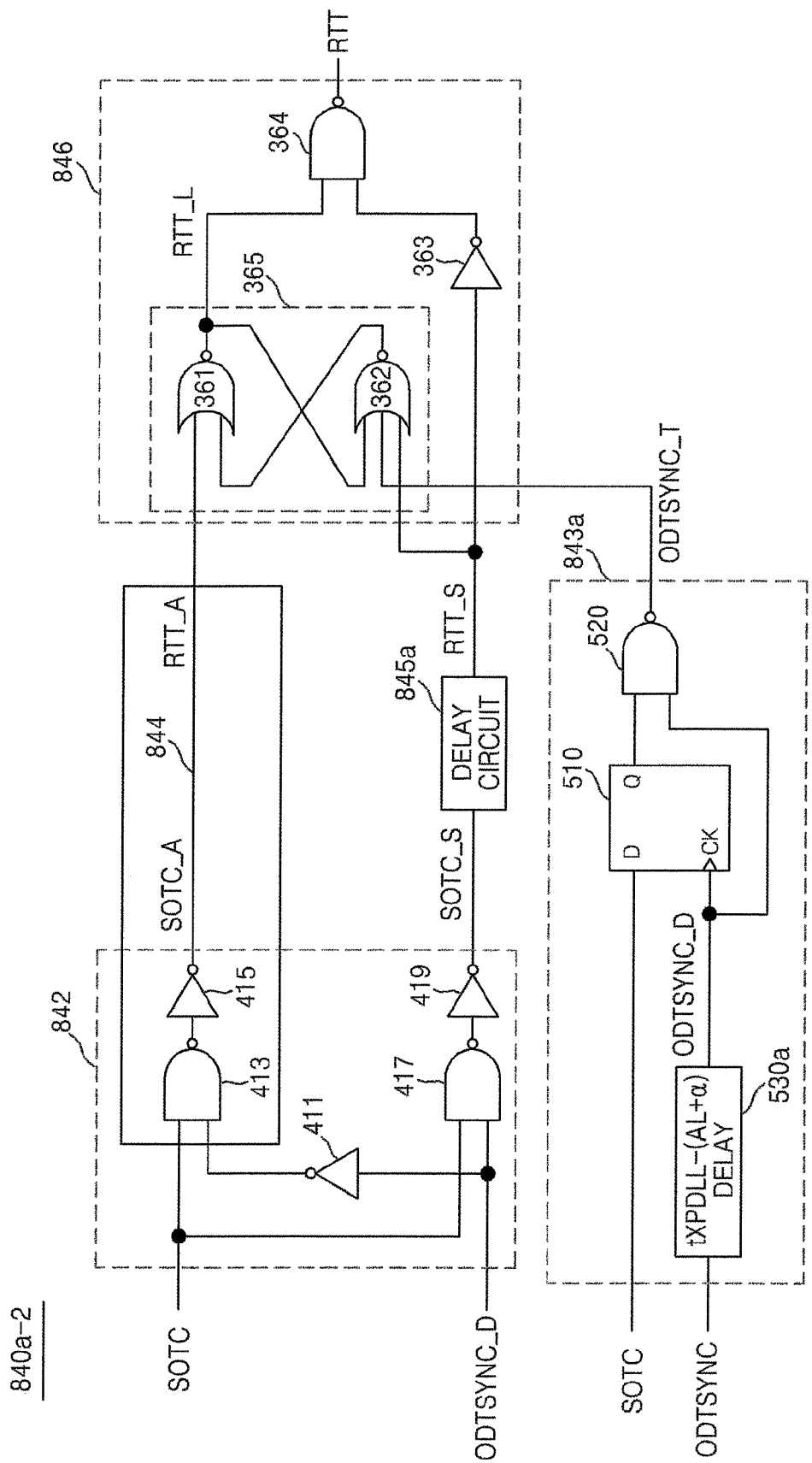
FIGS. 15 through 17 illustrate an ODT control circuit and delay circuits according to another embodiment of the present invention.
Figure 16:
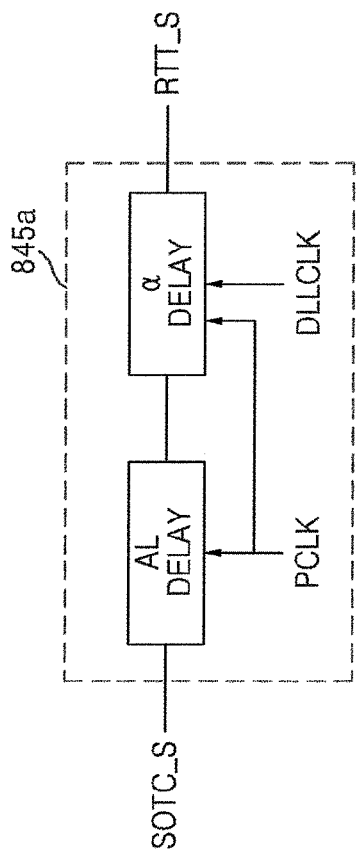
Figure 17:
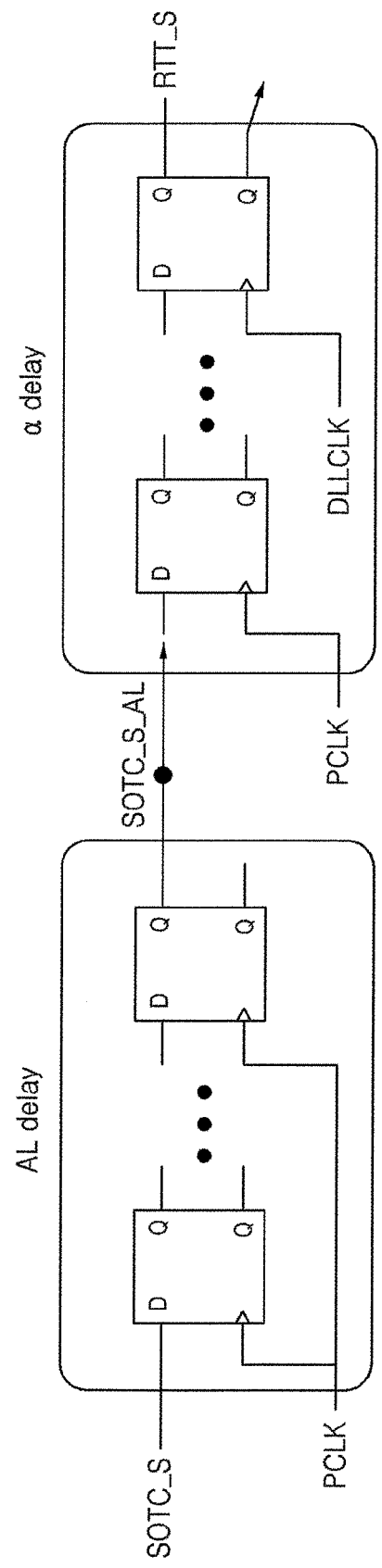

In particular, referring to FIG. 15, the ODT detection part 843a includes a delay circuit which delays the ODTSYNC signal by tXPDLL-(AL+α) to obtain the delayed ODTSYNC_D signal. Further, referring additionally to FIGS. 16 and 17, the delay circuit 845a of the synchronous path includes an AL delay controlled by the internal clock PCLK and an αdelay also controlled by the internal clock PCLK. Each delay may be formed by series connected flip-flop circuits. In addition, the αdelay may further be controlled by the DLL clock signal DLLCLK.

Except as noted above, the example represented by FIG. 15 is the same as that represented by previously described FIG. 10. Accordingly, a further detailed description of the ODT control circuit 840a-2 is omitted here to avoid redundancy in the description.

Figure 18:
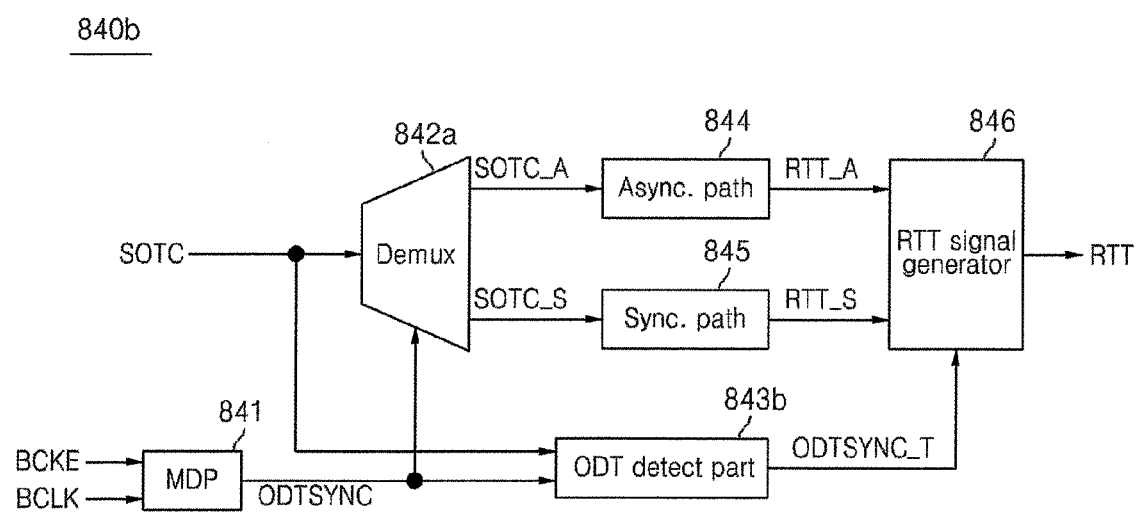
FIGS. 18 and 19 illustrate an ODT control circuit according to another embodiment of the present invention.
Figure 19:
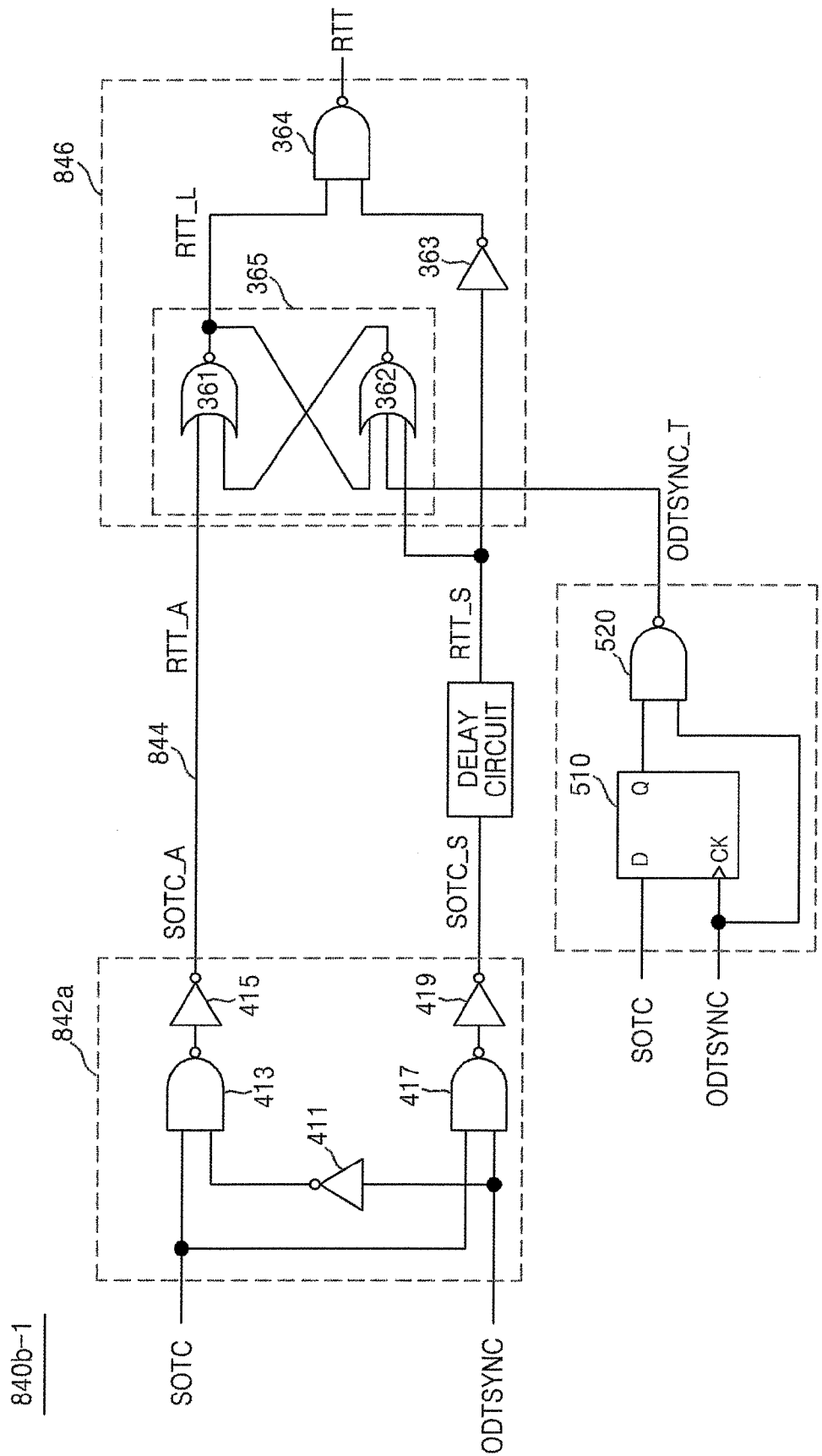

FIG. 18 is a block diagram illustrating another exemplary embodiment of an ODT control circuit according to the present invention, and FIG. 19 is a circuit example of the same.

The ODT control circuit 840b of FIGS. 18 and 19 is similar to that of FIG. 9 and 10, except that the delay of the ODTSYNC signal is omitted within the ODT detection part 843b in the embodiment FIGS. 18 and 19. Further, the ODTSYNC signal is applied to the demultiplexer 842a in the embodiment of FIGS. 18 and 19, rather than the delayed ODTSYNC_D signal. Otherwise, the example represented by FIGS. 18 and 19 is the same as that represented by previously described FIGS. 9 and 10. Accordingly, a further detailed structural description of the ODT control circuit 840b is omitted here to avoid redundancy in the description.

An operational example of the control circuit 840b of FIGS. 18 and 19 will now be described with reference to the timing diagram of FIGS. 20.

Figure 20:
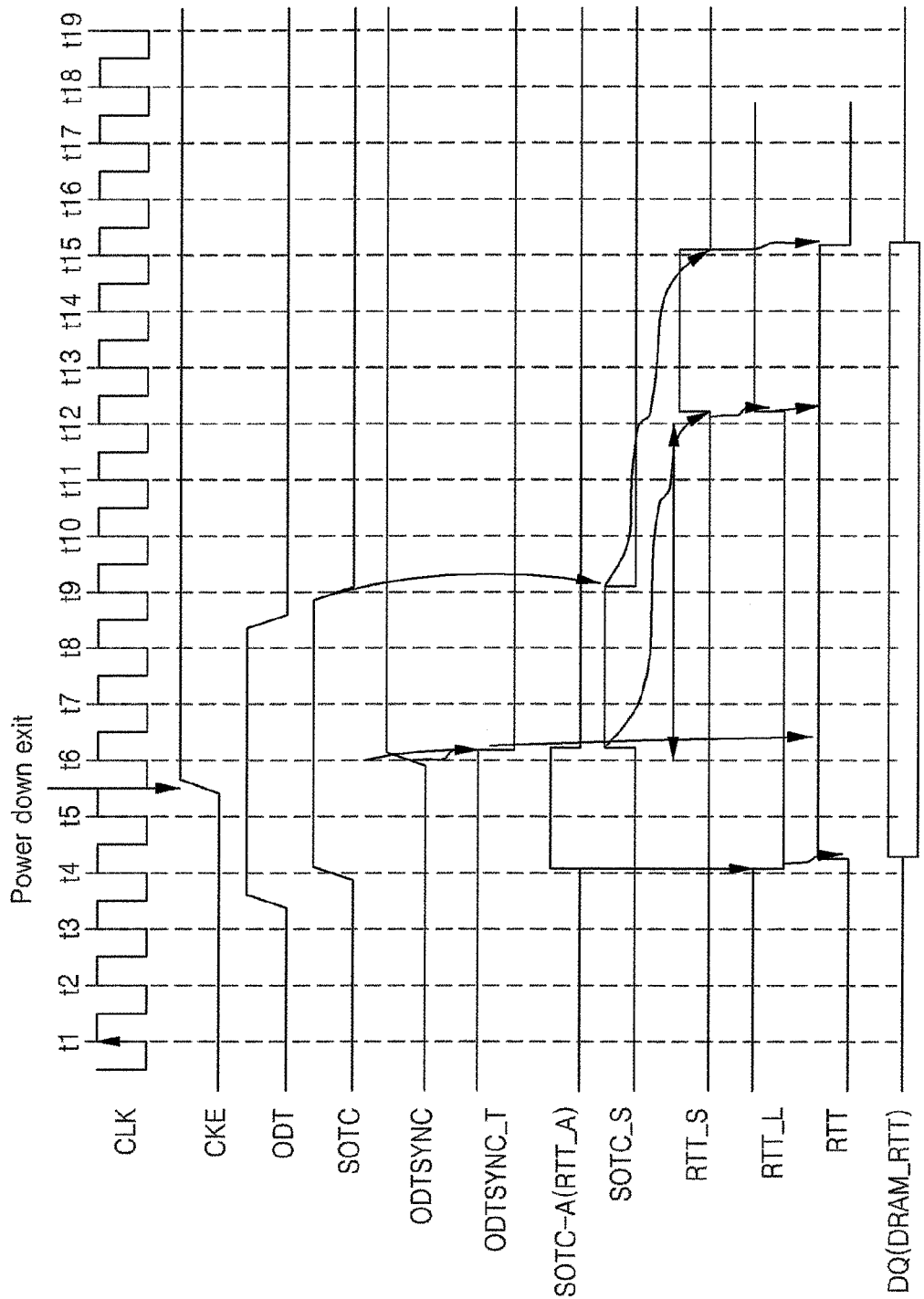
FIG. 20 is a timing diagram for explaining an operation of the ODT control circuit illustrated in FIGS. 18 and 19.

Referring collectively to FIGS. 19 and 20, the ODT control signal goes HIGH, and shortly thereafter the buffered ODT control signal SOTC goes HIGH. At this time, the clock enable signal CKE is LOW (i.e., the DLL circuit is OFF), and the ODTSYNC signal is LOW. Thus, the signal SOTC_A (RTT_A) on the asynchronous path 844 goes HIGH, the latch signal RTT_L goes LOW, and the output signal RTT goes HIGH. As such, the resistive termination circuit DRAM_RTT is activated in an asynchronous operation.

Next, while the ODT control signal remains HIGH, the power down exit occurs in which the clock enable signal CKE is activated. The DLL circuit is thereby activated, which causes the ODTSYNC signal to go HIGH. Since the buffered ODT control signal SOTC is HIGH, the ODTSYNC_T signal goes LOW, the signal SOTC_A (RTT_A) on the asynchronous path 844 goes LOW, and the signal SOTC_S on the synchronous path goes HIGH. The latch signal RTT_L remains HIGH as a result of the LOW state of the ODTSYNC_T signal. Thus, the resistive termination DRAM_RTT remains activated.

Thereafter, in FIG. 14, the ODT control signal goes LOW, and shortly thereafter, the buffered ODT control signal SOTC goes LOW. This causes the synchronous buffered ODT signal SOTC_S to go LOW, but does not alter the ODTSYNC_T signal since the ODTSYNC signal remains HIGH.

The synchronous buffered ODT signal SOTC_S is delayed by the delay circuit 845 for a time period to obtain the synchronous RTT signal RTT_S. When the synchronous RTT signal RTT_S goes HIGH, the latch output RTT_L goes LOW. However, the RTT output signal remains HIGH as a result of the inverted RTT signal RTT_S from the inverter 363.

When the synchronous RTT signal RTT_S goes LOW, the RTT output signal goes LOW, and the resistive termination DRAM_RTT is terminated.

As described above, the transition from an asynchronous ODT circuit path to a synchronous ODT circuit path is delayed to compensate for an operational latency of a delay locked loop (DLL) circuit. In this manner, ODT execution is not adversely impacted by the unstable DLL operation that occurs for a time period after the DLL is turned on.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents

What is claimed is:

1. An on-die termination (ODT) control circuit, comprising:
   a mode detection circuit which delays a mode detection signal indicative of an operational mode of a memory device, and which generates a corresponding delayed mode detection signal;
   a switching circuit which is responsive to the delayed mode detection signal to selectively apply an ODT control signal to an asynchronous circuit path or a synchronous circuit path; and
   a resistive termination signal generator which generates a resistive termination control signal according to the ODT control signal selectively applied to the asynchronous and synchronous circuit paths.

2. The ODT control circuit of claim 1, wherein the resistive termination signal generator includes a latch circuit which latches the ODT control signal applied to the asynchronous circuit path.

3. The ODT control circuit of claim 2, wherein the mode detection circuit further generates a latch control signal which controls the latch circuit according to the delayed mode detection signal and the ODT control signal.

4. The ODT control circuit of claim 3, wherein the delayed mode detection signal transitions from a first logic level to a second logic a given time period after the mode detection signal indicates an exit from a power down mode, and
   wherein the switching circuit applies the ODT control signal to the asynchronous circuit path when the delayed mode detection signal is the first logic level, and applies the ODT control signal to the synchronous circuit path when the delayed mode detection signal is the second logic level.

5. The ODT control circuit of claim 4, wherein the synchronous circuit path includes a delay circuit controlled by a delay locked loop (DLL) circuit.

6. An on-die termination (ODT) control circuit which generates a resistive termination control signal according to an externally supplied ODT control signal and a delayed lock loop (DLL) signal, the ODT control circuit comprising:
   an asynchronous path for transmitting the ODT control signal in an asynchronous mode;
   a synchronous path for transmitting the ODT control signal in a synchronous mode; and
   a latch circuit which latches the resistive termination control signal in a transition operation from the asynchronous mode to the synchronous mode.

7. The ODT control circuit of claim 6, wherein the latch circuit is responsive to the DLL signal.

8. The ODT control circuit of claim 6, further comprising a DLL delay circuit which delays the DLL signal, and wherein the latch circuit is responsive to the delayed DLL signal.

9. The ODT control circuit of claim 7, wherein the synchronous path includes a delay circuit controlled by the DLL signal.

10. An on-die termination (ODT) control circuit which generates a resistive termination control signal according to an externally supplied ODT control signal, the ODT control circuit comprising:
    a mode detection circuit which outputs a mode detection signal;
    an ODT detection circuit which detects an ODT mode according to the mode detection signal and the ODT control signal;
    a demultiplexer which selectively applies the ODT control signal to an asynchronous path or a synchronous path; and
    a control signal generator which generates the resistive termination control signal and which is coupled to outputs of the asynchronous path and synchronous path and to an output of the ODT detection circuit.

11. The ODT control circuit of claim 10, wherein the mode detection signal is activated by the mode detection circuit when a clock enable signal is activated.

12. The ODT control circuit of claim 10, wherein the ODT detection circuit comprises delay circuit which delays the mode detection signal.

13. The ODT control circuit of claim 12, wherein the ODT detection circuit further comprises a flip-flop circuit and a logic circuit, wherein the flip-flop circuit include a clock terminal which receives the delayed mode detection signal, an input terminal which receives the ODT control signal, and an output terminal, and wherein the logic circuit includes a first input connected to the output terminal of the flip-flop circuit and a second input which receives the delayed mode detection signal.

14. The ODT control circuit of claim 12, wherein the delayed mode detection signal controls an operation of the multiplexer.

15. The ODT control circuit of claim 10, wherein the ODT detection circuit comprises a flip-flop circuit and a logic circuit, wherein the flip-flop circuit includes a clock terminal which receives the mode detection signal, an input terminal which receives the ODT control signal, and an output terminal, and wherein the logic circuit includes a first input connected to the output terminal of the flip-flop circuit and a second input which receives the mode detection signal.

16. The ODT control circuit of claim 15, wherein the mode detection signal controls an operation of the multiplexer.

17. The ODT control circuit of claim 10, wherein the control signal generator includes a latch circuit coupled to an output of the ODT detection circuit and to outputs of the asynchronous path and synchronous path.

18. The ODT control circuit of claim 10, wherein the asynchronous path includes a delay line, and the synchronous path include a delay circuit.

19. The ODT control circuit of claim 18, wherein the delay circuit operates under control of a delayed lock loop (DLL) signal.

20. The ODT control circuit of claim 19, wherein the delay circuit further operates under control of an internal clock signal.

21. A memory system, comprising a data bus, a controller which generates a plurality clock enable signals and a plurality of on-die-termination (ODT) control signals, and a plurality of memory devices coupled to the data bus, wherein each of the memory devices include an ODT circuit which is responsive to a respective clock enable signal and a respective ODT control signal to provide a resistive termination for the data bus, wherein the ODT circuit delays the transition from an asynchronous ODT circuit path to a synchronous ODT circuit path to compensate for an operational latency of a delay locked loop (DLL) circuit of the memory device.

22. The memory system of claim 21, wherein the memory devices are mounted to single in-line memory modules (SIMM's).

23. The memory system of claim 21, wherein the memory devices are mounted to dual in-line memory modules (DIMM's).

24. A method of controlling an on-die termination (ODT) circuit during transition from a first power mode to a second power mode of a memory device, comprising delaying the transition from an asynchronous ODT circuit path to a synchronous ODT circuit path to compensate for an operational latency of a delay locked loop (DLL) circuit.

25. The method of claim 24, wherein the first power mode is a power down mode.

26. The method of claim 24, wherein the DLL circuit is used to control a delay circuit contained in the synchronous circuit path.

* * * * *